United States Patent [19]

Leupold

[11] Patent Number: 5,113,135

[45] Date of Patent: May 12, 1992

[54] CRITICAL FIELD AND CONTINUITY TESTING METHOD AND DEVICE FOR SUPERCONDUCTING MATERIALS USING THE CHANGE IN INTERNAL AREA OF A SUPERCONDUCTING LOOP

[75] Inventor: Herbert A. Leupold, Eatontown, N.J.

[73] Assignee: The United States of America as represented by the Secretary of the Army, Washington, D.C.

[21] Appl. No.: 673,422

[22] Filed: Mar. 22, 1991

[51] Int. Cl.⁵ .................. G01R 33/12; G01N 27/72
[52] U.S. Cl. .................................... 324/228; 324/202; 324/235; 324/262; 505/726; 505/843
[58] Field of Search .................... 324/202, 228-231, 324/234-240, 248, 262, 263; 505/726, 843

[56] References Cited

U.S. PATENT DOCUMENTS

| | | | |
|---|---|---|---|
| 3,626,344 | 12/1971 | Shaternikov et al. | 324/230 X |
| 4,414,507 | 11/1983 | Chen | 324/228 X |
| 4,864,236 | 9/1989 | Gibson et al. | 324/234 X |
| 4,901,017 | 2/1990 | Zinke | 324/229 X |

Primary Examiner—Gerard R. Strecker
Attorney, Agent, or Firm—Michael Zelenka; William H. Anderson

[57] ABSTRACT

The area of a loop made of superconducting material is decreased to increase the magnetic field on the surface of a test piece adjacent the loop for determining the critical field, $H_c$, of the test piece. A loop with a gap having a temporary plug placed therein in which a persistent current is established has a nozzle forming the gap thereon for receiving a test piece. The test piece then completes the circuit permitting removal of the temporary plug. The area of the loop is then decreased resulting in an increase in magnetic field at the surface of the test piece. When the critical field of the test piece is reached, magnetic flux will leak from the internal area of the loop, thereby determining the critical field of the test piece. A continuous length of superconducting material can be tested for discontinuities or spots of low critical field, $H_c$.

3 Claims, 1 Drawing Sheet

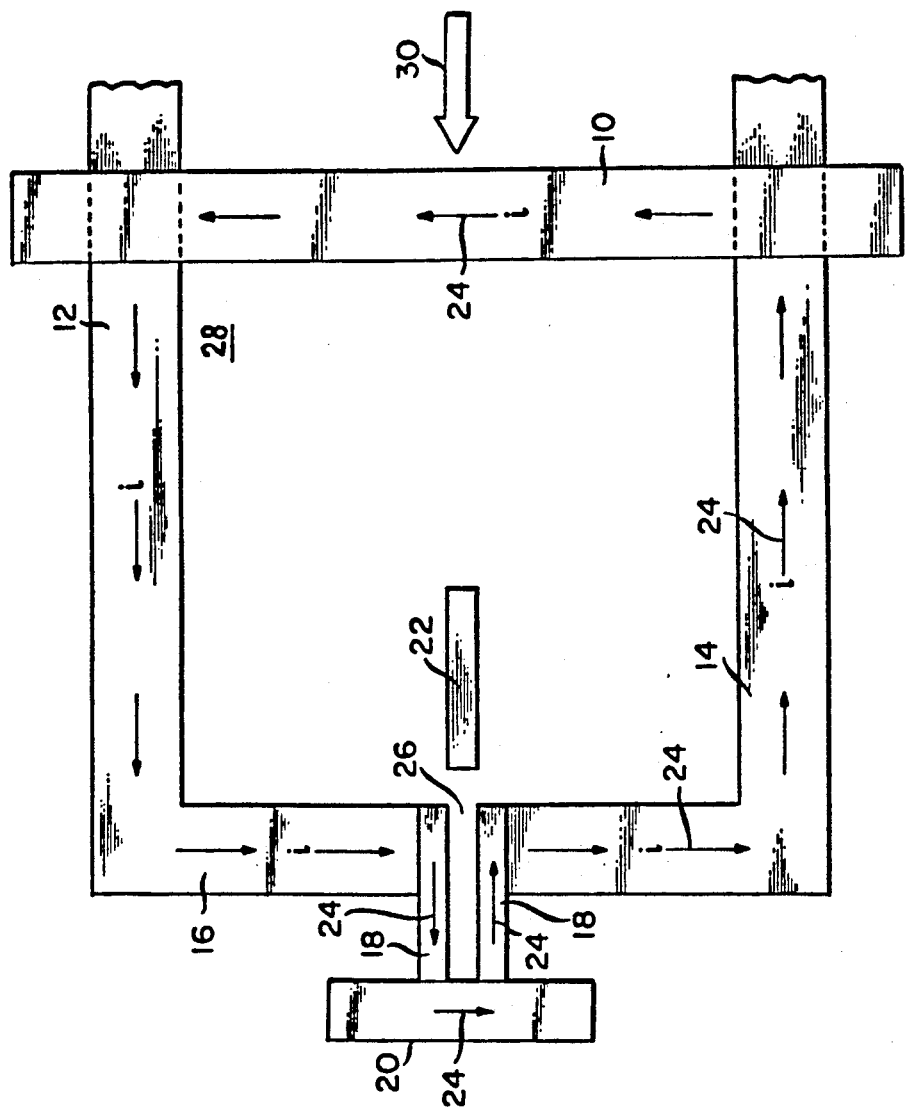
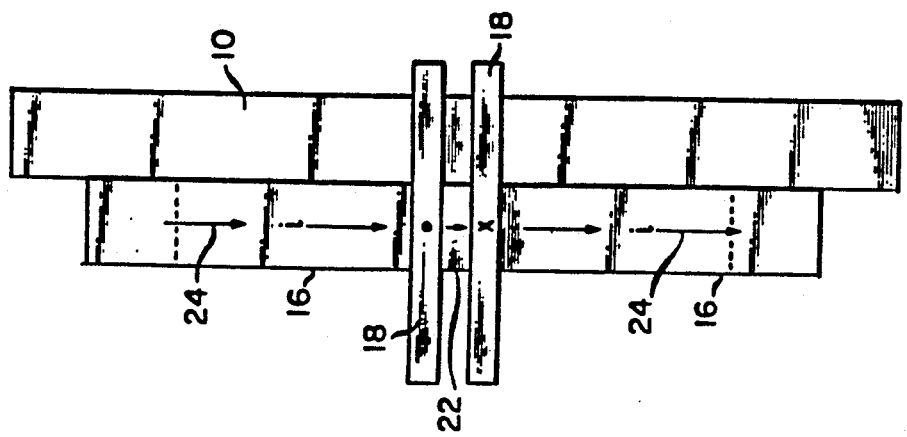

CRITICAL FIELD AND CONTINUITY TESTING METHOD AND DEVICE FOR SUPERCONDUCTING MATERIALS USING THE CHANGE IN INTERNAL AREA OF A SUPERCONDUCTING LOOP

GOVERNMENT INTEREST

The invention described herein may be manufactured, used, and licensed by or for the Government for governmental purposes without the payment to me of any royalty thereon.

FIELD OF THE INVENTION

This invention relates generally to a superconductor testing device, and more specifically to a device for determining the critical field in a superconductor and sections of low critical field material.

BACKGROUND OF THE INVENTION

The search for new materials evidencing superconducting properties has expanded conservatively. This has resulted in a rapid discovery of new materials possessing superconducting properties. Typically, these materials must be tested to determine their superconducting properties. Often, in order to test these newly discovered materials, special apparati are constructed to test for specific parameters such as the critical field, $H_c$. The critical field, $H_c$, is defined as the magnetic field at which the superconducting material will become normal, or no longer be superconducting.

Many practical applications, developed for the use of these new superconducting materials, are accomplished by long strips, ribbons, or wire of superconducting material. Typically, the superconducting material is more easily manufactured in these forms, thereby attributing to their use in practical applications. However, it is often difficult to test the superconducting continuity of such long strands, ribbons, or wires. Therefore, if a small portion of the superconducting material has a low critical field, $H_c$, the operation of the whole device incorporating the superconducting material may be in jeopardy.

Therefore, as a result of the rapidly increasing discovery of new materials having superconducting properties and the efforts in which to devise practical applications therefor, there is an urgent need for providing the ability to test them quickly and efficiently.

SUMMARY OF THE INVENTION

The present invention is directed to an apparatus for testing materials having superconducting properties. A loop made of superconducting material having a small gap is formed. The loop is made such that the substantially closed area formed thereby can be changed. A nozzle protruding from the loop forming a small gap therein is adapted to receive a test piece made of another superconducting material. Once a persistent current is established in the loop flowing through the test piece, the internal area formed by the loop is reduced. This increases the magnetic field at the surface of the test piece. When the critical field, $H_c$, is reached, the test piece becomes normal and magnetic flux leaks from the internal area formed from the loop. The critical field, $H_c$, of the test piece is thereby established.

Additionally, the present invention is used to test for discontinuities or low $H_c$ material portions in a continuous strip, ribbon, or wire of superconducting material. The continuous strip, ribbon, or wire is run in contact with and across the nozzle of the present invention. A threshold critical field, $H_{CT}$, can easily be selected by varying the area formed by the loop such that when a discontinuity or low $H_c$ portion of the material is reached, the material will become normal and magnetic flux will leak from within the loop which is detected.

Accordingly, it is an object of the present invention to determine the critical field, $H_c$, of a superconducting test piece.

It is yet another object of the present invention to test a continuous strip, ribbon, or wire of superconducting material for discontinuities or low $H_c$ portions.

It is an advantage of the present invention that it is relatively simple and easy to use.

It is yet another advantage of the present invention that it can test a continuous length of superconducting material.

It is a feature of the present invention that the internal area of a loop formed by superconducting material can be changed.

It is yet another feature of the present invention that the magnetic field the surface of a test piece can be controllably changed.

These and other objects, advantages, and features will become more readily apparent in view of the following more detailed description and drawings.

BRIEF DESCRIPTION OF THE DRAWINGS

FIG. 1 is a side schematic illustrating the present invention.

FIG. 2 is a front schematic illustrating the present invention.

DETAILED DESCRIPTION OF THE PREFERRED EMBODIMENT

FIG. 1 generally illustrates the present invention. A substantially continuous loop is formed by sliding bar 10 intersecting an upper leg 12 and a lower leg 14. The loop is substantially completed by front leg 16. However, a nozzle 18 is formed within front leg 16. The nozzle 18 has a gap 26 therein. This gap 26 prevents the complete formation of a continuous loop. However, when the term "loop" is used in the present application, it can mean a continuous loop, or a substantially continuous loop. Therefore, a loop is defined by sliding bar 10, upper leg 12, lower leg 14, and front leg 16. A substantially completed loop is formed thereby. The small gap 26 in front leg 16 does not prevent the formation of the substantially continuous loop. The internal area formed by the substantially continuous loop is indicated as 28. Therefore, this internal area 28 can be increased or reduced by sliding bar 10 along upper leg 12 and lower leg 14 closer to or farther away from front leg 16. The bar 10, upper leg 12, lower leg 14, and front leg 16 are all made of a superconducting material having a higher critical field, $H_c$, than that expected for a test piece 20. Additionally, it should be well understood that a sliding bar 10 is illustrated for changing the internal area 28 of the substantially complete loop. However, other means for changing the internal area 28 can be provided, such as a flexible ribbon, a bellows, or a piston arrangement.

FIG. 2 is a front view of the present invention which more clearly illustrates the nozzle 18. However, in FIG. 2, the test piece 20 is removed and a temporary plug 22 can be seen in gap 26. The nozzle 18 can have ends adapted to fit any desired test piece, not illustrated in FIG. 2.

The operation of the present invention can readily be understood with reference to FIGS. 1 and 2. A persistent current is established in the substantially complete loop formed by sliding bar 10, upper leg 12, lower leg 14, and front leg 16 by insertion of temporary plug 22 in gap 26, thereby forming a complete continuous loop. Temporary plug 22 is additionally made of a superconducting material. The persistent current can thereby be generated by either of two methods. The first method is to place the loop in an appropriate magnetic field while it is above its transition temperature, and therefore, in the normal phase. The loop can then be cooled to below its transition temperature so that it becomes superconducting. The applied magnetic field is then removed and the persistent current which is induced by the removal sustains the originally applied magnetic flux in the interior area 28 of the loop. The magnetic flux is therefore trapped. The second method is to cool the loop to below its transition temperature, thereby making the loop superconducting. The loop is then placed in a magnetic field greater than the critical field s that the loop loses its superconducting property and becomes normal, allowing the magnetic flux to penetrate uniformly throughout the interior area 28. The magnetic field is then removed, causing the loop to become superconducting, thereby trapping the magnetic flux within the interior area 28. Either of these two methods will create a persistent current, represented by arrows 24, sufficient to maintain a magnetic field within the interior area 28.

Once the persistent current, represented by arrows 24, is created in the loop, a test piece 20 is placed on the nozzle 18 bridging gap 26. Once the test piece 20 is positioned on nozzle 18, the temporary plug 22 is removed from gap 26. Thereby, the persistent current is forced to flow through test piece 20 as illustrated by arrows 24. This maintains the continuity of the continuous loop.

The critical field, $H_c$, of the test piece 20, can now be established by applying a force, represented by arrow 30, to sliding bar 10. The force, represented by arrow 30, forces sliding bar 10 closer to front bar 16. This reduces the internal area 28 formed by the loop. The magnetic flux density trapped within the internal area 28 formed by the loop is thereby forced to increase to keep the total flux constant. This increased magnetic flux density increases the magnetic field on the surface of the test piece 20. A critical magnetic field, $H_c$, is reached whereby the test piece becomes normal and is no longer superconducting. At this point, the magnetic flux trapped within interior area 28 quickly dissipates. The dissipated magnetic flux within the interior area 28 can readily be detected by a Hall effect probe, or the elimination of resistance to the force, represented by arrow 30, applied to sliding bar 10. The magnetic field can then be calculated, at which point the test piece 20 went normal, establishing the critical field for the test piece 20. A force vs. magnetic field calibration can be made such that when a force applied to sliding bar 10 is known, the magnetic field at the surface of test piece 20 is also known.

The present invention can also be applied to quality control testing of continuous superconducting strips, ribbons, or wires. A portion of the continuous length of the material to be tested is placed across gap 26 contacting the nozzle 18. The nozzle 18, in this application, should have a width at least as wide as the material to be tested. A threshold magnetic critical field, $H_{CT}$, can then be specified below which the material being tested should always remain superconducting. The sliding bar 10 can thereby be set in a position to establish the threshold critical field, $H_{CT}$, at the surface of the continuous test piece. The continuous test piece can then be passed across nozzle 18. As long as the material being tested has a critical field $H_c$ higher than that of the predetermined threshold critical field, $H_{CT}$, flux will be prevented from leaking from interior area 28. However, should a superconducting discontinuity, or a portion of the material have a critical field, $H_c$, lower than the predetermined threshold critical field, $H_{CT}$, established, the portion of the superconductor material being tested passing over gap 26 contacting nozzle 18 will become normal, resulting in flux leaking from interior area 28. Thereby, indicating that portion of superconducting material that does not meet the threshold critical field specifications. Therefore, the present invention can be used to quickly identify specific sections of continuous superconducting material that do not meet product specifications.

It should be understood that the embodiments depicted and described can be combined in different configurations, and that various modifications or alterations may be made without departing from the spirit and scope of the invention as set forth in the claims.

What is claimed is:

1. An apparatus for testing the superconducting magnetic critical field of material shaving superconducting properties comprising:

a loop of superconducting material, the loop forming an internal area and having a gap formed therein, the gap being of a predetermined size;

a plug of superconducting material having a predetermined size so as to fit within the gap and complete the loop;

means for connecting a superconducting test piece across the gap to complete the loop when the plug is removed;

means for changing the internal area formed by the loop; and means for generating a persistent current within the loop while the superconducting plug is inserted in the gap;

wherein a persistent current is generated within the loop while the plug is inserted in the gap, whereby a magnetic field is generated in the internal area of the loop normal to the direction of the persistent current;

wherein the test piece is connected to the loop and the plug is removed; and wherein the internal area of the loop is decreased by the means for changing the internal area thereby increasing the magnitude of the magnetic field in the internal area, the internal area of the loop being decreased until the persistent current and the magnetic field within the internal of the loop no longer exists, the superconducting magnetic critical field of the test piece being determined from the amount of force required to decrease the internal area of the loop.

2. A superconducting detector as in claim 1 wherein:

a portion of said loop is formed by an upper and lower leg; and said means for changing the internal area formed by said loop is a bar intersecting said upper and lower legs and sliding thereon.

3. A method for testing the superconducting magnetic critical field of materials having superconducting properties comprising the steps of:

forming a loop of superconducting material, the loop having an internal area and having a gap formed within the loop, the gap being of a predetermined size;

placing a plug of superconducting material having a predetermined size within the gap in order to complete the loop;

generating a persistent current within the loop while the superconducting plug is inserted in the gap, whereby a magnetic field is generated in the internal area of the loop normal to the direction of the persistent current;

connecting a superconducting test piece of the loop so as to complete the loop when the superconducting plug is removed from the gap;

removing the superconducting plug from the gap;

decreasing the internal area of the loop, thereby increasing the magnitude of the magnetic field of the internal area, the internal area of the loop being decreased until the persistent current and the magnetic field within the internal of the loop no longer exists; and determining the superconducting magnetic critical field of the test piece from the amount of force required to decrease the internal area of the loop.

* * * * *